United States Patent
Rossi

(10) Patent No.: US 10,103,688 B2
(45) Date of Patent: Oct. 16, 2018

(54) SYSTEMS AND METHODS FOR IMPROVED INSTALLATION AND GROUNDING OF PHOTOVOLTAIC ASSEMBLIES

(71) Applicant: SUNPOWER CORPORATION, San Jose, CA (US)

(72) Inventor: Gary Alan Rossi, Pleasant Hill, CA (US)

(73) Assignee: SunPower Corporation, San Jose, CA (US)

(*) Notice: Subject to any disclaimer, the term of this patent is extended or adjusted under 35 U.S.C. 154(b) by 196 days.

(21) Appl. No.: 15/280,987

(22) Filed: Sep. 29, 2016

(65) Prior Publication Data

US 2018/0091091 A1 Mar. 29, 2018

(51) Int. Cl.
*H02S 40/34* (2014.01)
*H01L 31/048* (2014.01)
(Continued)

(52) U.S. Cl.
CPC ............ *H02S 40/34* (2014.12); *H01L 31/048* (2013.01); *H01R 4/301* (2013.01); *H01R 4/64* (2013.01); *H02S 30/10* (2014.12)

(58) Field of Classification Search
CPC ......... H02S 40/34; H02S 30/10; H01L 31/048
See application file for complete search history.

(56) References Cited

U.S. PATENT DOCUMENTS 5,280,133 A * 1/1994 Nath ..................... H01L 31/048
136/251
7,435,134 B2 10/2008 Lenox
(Continued)

OTHER PUBLICATIONS

U.S. Appl. No. 15/242,275, filed Aug. 19, 2016, titled "Systems and Methods for Improved Installation of Photovoltaic Assemblies", by inventor John Paul Kapla et al., 34 pages (specification and drawings).
U.S. Appl. No. 15/253,814, filed Aug. 31, 2016, titled "Systems and Methods for Improved Installation of Photovoltaic Assemblies", by inventor John Paul Kapla et al., 35 pages (specification and drawings).

(Continued)

*Primary Examiner* — Paola Agudelo
(74) *Attorney, Agent, or Firm* — Schwabe, Williamson & Wyatt, P.C.

(57) ABSTRACT

Improved PV assemblies for converting solar radiation to electrical energy and methods of installation thereof are disclosed herein. PV arrays comprising a plurality PV modules are also described herein. A PV assembly can comprise a plurality of PV modules arranged into rows and/or columns of a PV array. A PV module can comprise a plurality of solar cells encapsulated within a PV laminate. In some embodiments, a PV module includes a frame at least partially surrounding the PV laminate. A PV assembly can further comprise at least one flexible grounding connector positioned between a plurality of PV modules, adjacent rows of PV modules in an array and/or a column of PV modules in an array. A flexible grounding connector can comprise a first and a second engagement head for engaging a first and a second PV module. A flexible grounding connector can further comprise a flexible body portion coupling first and second engagement heads. The flexible body portion of the flexible grounding connector can be electrically conductive so as to provide an electrical grounding path between first and second PV modules and accommodate any misalignment or offset between first and second PV modules.

19 Claims, 15 Drawing Sheets

(51) Int. Cl.
  *H02S 30/10*  (2014.01)
  *H01R 4/64*   (2006.01)
  *H01R 4/30*   (2006.01)

(56) References Cited

U.S. PATENT DOCUMENTS

| | | | |
|---|---|---|---|
| 7,780,472 B2 | 8/2010 | Lenox | |
| 8,424,255 B2 | 4/2013 | Lenox et al. | |
| 8,763,316 B2 | 7/2014 | Concho et al. | |
| 9,416,992 B2 | 8/2016 | Braunstein et al. | |
| 9,474,154 B2 * | 10/2016 | Johansson | H05K 3/363 |
| 9,882,330 B2 * | 1/2018 | Kalman | H01R 35/04 |
| 2004/0127092 A1 * | 7/2004 | Yamada | H01R 12/62 |
| | | | 439/498 |
| 2008/0053517 A1 * | 3/2008 | Plaisted | F24J 2/5207 |
| | | | 136/251 |
| 2013/0011187 A1 * | 1/2013 | Schuit | F16B 2/065 |
| | | | 403/287 |
| 2014/0311054 A1 | 10/2014 | Concho et al. | |
| 2016/0285408 A1 * | 9/2016 | Ash | H02S 20/23 |
| 2016/0329858 A1 * | 11/2016 | Stoddard | H02S 20/20 |
| 2017/0149378 A1 * | 5/2017 | Castonguay | H02S 40/34 |
| 2017/0359020 A1 * | 12/2017 | Andrews | H02S 40/34 |
| 2018/0091091 A1 * | 3/2018 | Rossi | H02S 40/34 |

OTHER PUBLICATIONS

"DynoRaxx Supporting Your Investment", "Dynobond", http://dynoraxx.com/grounding/dynobond/, 2016, 2 pages.

* cited by examiner

SYSTEMS AND METHODS FOR IMPROVED INSTALLATION AND GROUNDING OF PHOTOVOLTAIC ASSEMBLIES

BACKGROUND

Solar power has long been viewed as an important alternative energy source. To this end, substantial efforts and investments have been made to develop and improve upon solar energy collection technology. Of particular interest are residential-, industrial- and commercial-type applications in which relatively significant amounts of solar energy can be collected and utilized in supplementing or satisfying power needs. One way of implementing solar energy collection technology is by assembling an array of multiple solar modules.

One type of solar energy system is a solar photovoltaic system. Solar photovoltaic systems ("photovoltaic systems") can employ solar panels made of silicon or other materials (e.g., III-V cells such as GaAs) to convert sunlight into electricity. Photovoltaic systems typically include a plurality of photovoltaic (PV) modules (or "solar tiles") interconnected with wiring to one or more appropriate electrical components (e.g., switches, inverters, junction boxes, etc.)

A typical conventional PV module includes a PV laminate or panel having an assembly of crystalline or amorphous semiconductor devices ("PV cells" or "solar cells") electrically interconnected and encapsulated within a weatherproof barrier. One or more electrical conductors are housed inside the PV laminate through which the solar-generated current is conducted.

Regardless of an exact construction of the PV laminate, most PV applications entail placing an array of solar modules at the installation site in a location where sunlight is readily present. This is especially true for residential, commercial or industrial applications in which multiple solar modules are desirable for generating substantial amounts of energy, with the rooftop of the structure providing a convenient surface at which the solar modules can be placed.

In some arrangements, solar modules are placed side-by-side in an array. Each solar module can be mounted to a support structure, such as a roof, by coupling the module to a mounting structure (e.g., a rail) by way of a coupling member (e.g., a clamp, clip, anchor or mount). It can be challenging to couple modules side-by-side because the array assembler typically engages the coupling member while also ensuring that adjacent modules are positioned properly on the mounting structure. Accordingly, there remains a continuing need for improved systems and methods for mounting solar modules to a support structure with minimal installation time and/or resources.

BRIEF DESCRIPTION OF THE DRAWINGS

The following drawings illustrate by way of example and not limitation. For the sake of brevity and clarity, every feature of a given structure is not always labeled in every figure in which that structure appears. Identical reference numbers do not necessarily indicate an identical structure. Rather, the same reference number may be used to indicate a similar feature or a feature with similar functionality, as may non-identical reference numbers. The figures are not drawn to scale.

DETAILED DESCRIPTION

Figure 1:
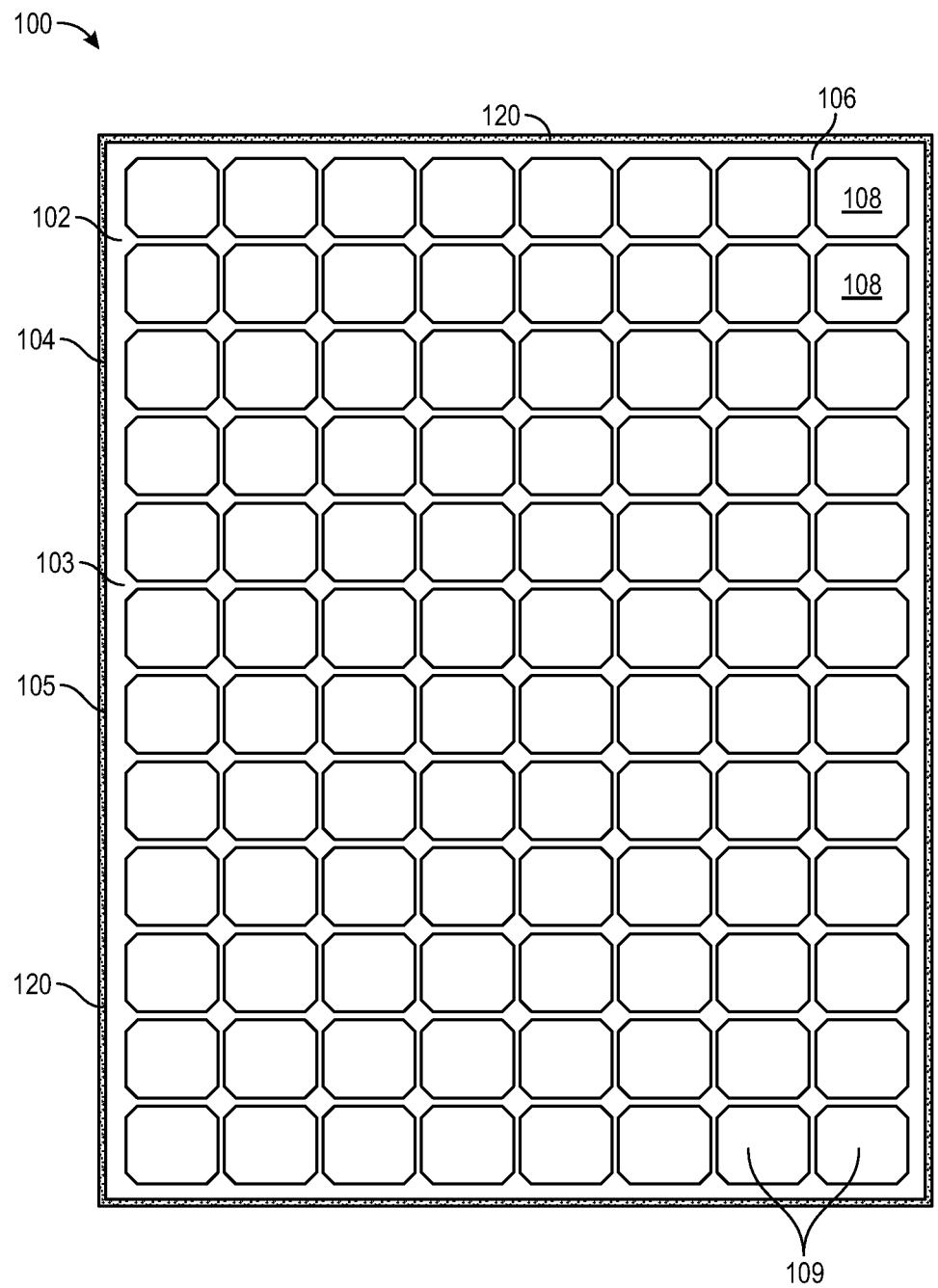
FIG. 1 depicts a front side of a photovoltaic (PV) module, in accordance with an embodiment of the present disclosure.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Certain terminology may be used in the following description for the purpose of reference only, and thus are not intended to be limiting. For example, terms such as "upper", "lower", "above", and "below" refer to directions in the drawings to which reference is made. Terms such as "front", "back", "rear", "side", "axial", and "lateral" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second", and other such numerical terms referring to structures do not imply a sequence or order unless clearly indicated by the context.

Terminology—The following paragraphs provide definitions and/or context for terms found in this disclosure (including the appended claims):

This specification includes references to "one embodiment" or "an embodiment." The appearances of the phrases "in one embodiment" or "in an embodiment" do not necessarily refer to the same embodiment. Particular features, structures, or characteristics can be combined in any suitable manner consistent with this disclosure.

The term "comprising" is open-ended. As used in the appended claims, this term does not foreclose additional structure or steps.

Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

As used herein, the terms "first," "second," etc. are used as labels for nouns that they precede, and do not imply any type of ordering (e.g., spatial, temporal, logical, etc.). For example, reference to a "first" encapsulant layer does not necessarily imply that this encapsulant layer is the first encapsulant layer in a sequence; instead the term "first" is used to differentiate this encapsulant from another encapsulant (e.g., a "second" encapsulant).

The terms "a" and "an" are defined as one or more unless this disclosure explicitly requires otherwise.

The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

As used herein, "inhibit" is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

As used herein, the term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed embodiment, the terms "substantially," "approximately," and "about" may be substituted with "within [a percentage] of" what is specified, where the percentage includes 0.1, 1, 5, and 10 percent.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present invention. The feature or features of one embodiment can be applied to other embodiments, even though not described or illustrated, unless expressly prohibited by this disclosure or the nature of the embodiments.

Various embodiments disclosed herein relate to mounting an array of photovoltaic (PV) or solar modules to a support structure, such as a roof. In some embodiments, PV modules can be positioned atop a mounting structure (e.g., a rail) coupled to a support surface. PV modules can be provided adjacent to one another and installed in rows and/or columns of an array. When installing solar modules to form a PV array or assembly, an assembler can be required to electrically ground accessible metal components, such as a PV module frame and/or ancillary mounting components. Commonly, the assembler runs a grounding wire between PV modules and then connects the grounding wire to a ground path. Considerable material and labor costs are commonly associated with grounding a PV array. Accordingly, various embodiments disclosed herein are configured to assist an assembler in constructing and grounding a PV array. For example, in some embodiments, a flexible grounding connector is provided between rows and/or columns of a PV array to enable minimal installation times and resources.

Improved PV assemblies for converting solar radiation to electrical energy and methods of installation thereof are disclosed herein. PV arrays comprising a plurality PV modules are also described herein. A PV assembly can comprise a plurality of PV modules arranged into rows and/or columns of a PV array. A PV module can comprise a plurality of solar cells encapsulated within a PV laminate. In some embodiments, a PV module includes a frame at least partially surrounding the PV laminate. A PV assembly can further comprise at least one flexible grounding connector positioned between a plurality of PV modules, adjacent rows of PV modules in an array and/or a column of PV modules in an array. A flexible grounding connector can comprise a first and a second engagement head for engaging a first and a second PV module. A flexible grounding connector can further comprise a flexible body portion coupling first and second engagement heads. The flexible body portion of the flexible grounding connector can be electrically conductive so as to provide an electrical grounding path between first and second PV modules and can accommodate any misalignment or offset between first and second PV modules.

FIG. 1 illustrates a top-down view of a module 100 having a front side 102 that faces the sun to collect solar radiation during normal operation and a back side 104 opposite the front side 102. The module 100 comprises a laminate 106 encapsulating a plurality of solar cells 108. In some embodiments, the module 100 can be 'frameless.' However, in other embodiments, module 100 comprises a support member or frame 120 surrounding the laminate 106, such as depicted in FIG. 1. In other embodiments, a support member or frame can partially surround the laminate. In some embodiments, the frame 120 can be integrally formed or formed as a unitary body. In other embodiments, the frame 120 can be formed from an assembly of parts. In an embodiment, frame 120 can comprise circumferentially extending flanges, ridges, edges or other protrusions. The frame 120 can be formed of a metal (e.g., aluminum) material, a polymeric material, or a combination thereof. The frame can be at least partially electrically conductive and in such embodiments, may need to be electrically grounded. In one embodiment, the frame comprises anodized aluminum and thus has a non-conductive outer surface. The frame may also have other types of non-conductive outer surfaces, such as a painted outer surface.

The solar cells 108 can face the front side 102 and can be arranged into a plurality of solar cell strings 109. The laminate 106 can include one or more encapsulating layers which surround and enclose the solar cells 108. In various embodiments, the laminate 106 comprises a top cover 103 made of glass or another transparent material on the front side 102. In certain embodiments, the material chosen for construction of the cover 103 can be selected for properties which minimize reflection, thereby permitting the maximum amount of sunlight to reach the solar cells 108. The top cover 103 can provide structural rigidity to the laminate 106. The laminate 106 can further comprise a backsheet 105 on the back side 104. The backsheet 105 can be a weatherproof and electrically insulating layer which protects the underside of the laminate 106. The backsheet 105 can be a polymer sheet, and it can be laminated to encapsulant layer(s) of the laminate 106, or it can be integral with one of the layers of the encapsulant.

Figure 2:
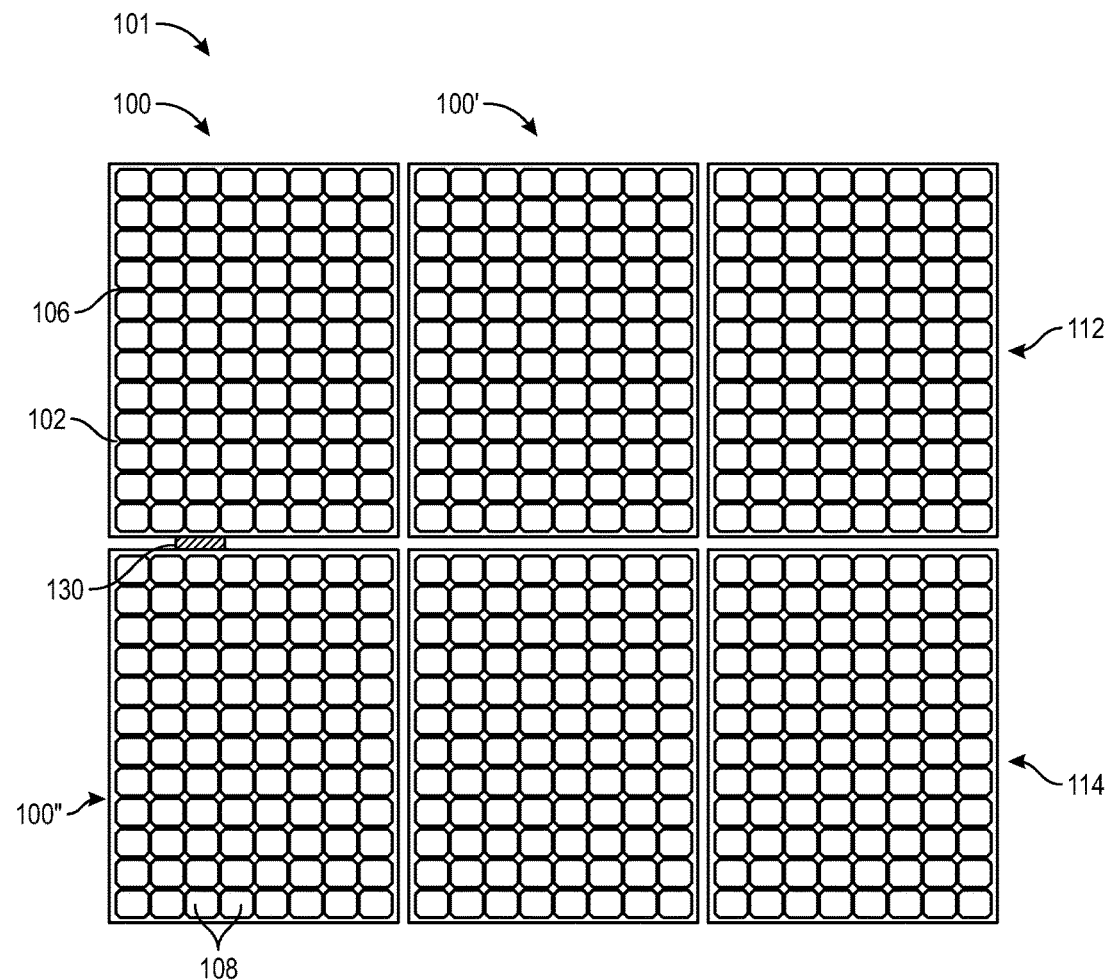
FIG. 2 depicts a front side of a PV assembly, in accordance with an embodiment of the present disclosure.

FIG. 2 illustrates a top-down view of a photovoltaic assembly 101 comprising a plurality of modules 100 (individual modules depicted as 100, 100', 100") arranged into a photovoltaic array 101. Each module 100 has a front side 102 that faces the sun during normal operation and a laminate 106 comprising a plurality of solar cells 108. The photovoltaic array 101 can be configured in a "portrait" orientation as depicted in FIG. 2. However in other embodiments, modules can be arranged in a "landscape" orientation. In yet other embodiments, modules can be arranged in a combination of "landscape" and "portrait" orientations. Six PV modules 100 are depicted in the example of FIG. 2, however, any desirable number of modules can be provided in any desirable configuration to form a PV array.

The PV assembly of FIG. 2 comprises a plurality of PV modules 100 arranged into a plurality of rows of PV array 101. For ease of description, three PV modules 100 are arranged into a first row 112 and three PV modules 100 are arranged into a second row 114. In one embodiment, the first and second rows 112/114 are adjacent such as depicted in FIG. 2. The first row 112 and the second row 114 can be separated by a predetermined distance or gap. The PV assembly of FIG. 2 further comprises a flexible grounding connector 130 positioned between PV modules of adjacent rows 112/114 of PV array 101. As depicted in FIG. 2, the flexible grounding connector 130 is located in the gap between adjacent rows 112/114.

The PV modules 100 can be mounted to a support structure, such as a roof for example by coupling the PV modules 100 to a mounting structure (e.g., a rail) by way of a coupling member (e.g., a clamp, clip, anchor or mount). In one embodiment, PV modules in first row 112 can share a common rail (e.g., a first metal rail) and PV modules in second row 114 can share a common rail (e.g., a second metal rail). Furthermore, PV modules in first row 112 can be electrically coupled or grounded to the first metal rail by metal coupling members and similarly, PV modules in second row 114 can be electrically coupled or grounded to the second metal rail by metal coupling members. Accordingly, PV modules in first row 112 can share a first electrical grounding path and PV modules in second row 114 can share a second electrical grounding path. In an embodiment, the flexible grounding connector 130 establishes or provides an electrical grounding path between PV modules of row 112 and PV modules of row 114. In other words, the flexible grounding connector 130 can establish or provide an electrical grounding path between two or more electrical grounding paths associated with two or more rows of a PV array.

In the exemplary embodiment depicted in FIG. 2, a single flexible grounding connector 130 is provided between adjacent modules 100 in adjacent rows 112/114. However, any desirable number of flexible grounding connectors can be provided in any desirable arrangement. In an embodiment, one or more flexible grounding connectors can be provided between adjacent rows of a PV array, adjacent columns of a PV array, or a combination thereof. In another embodiment, one or more flexible grounding connectors can be provided between non-adjacent rows of a PV array, non-adjacent columns of a PV array, or any combination thereof.

Figure 3:
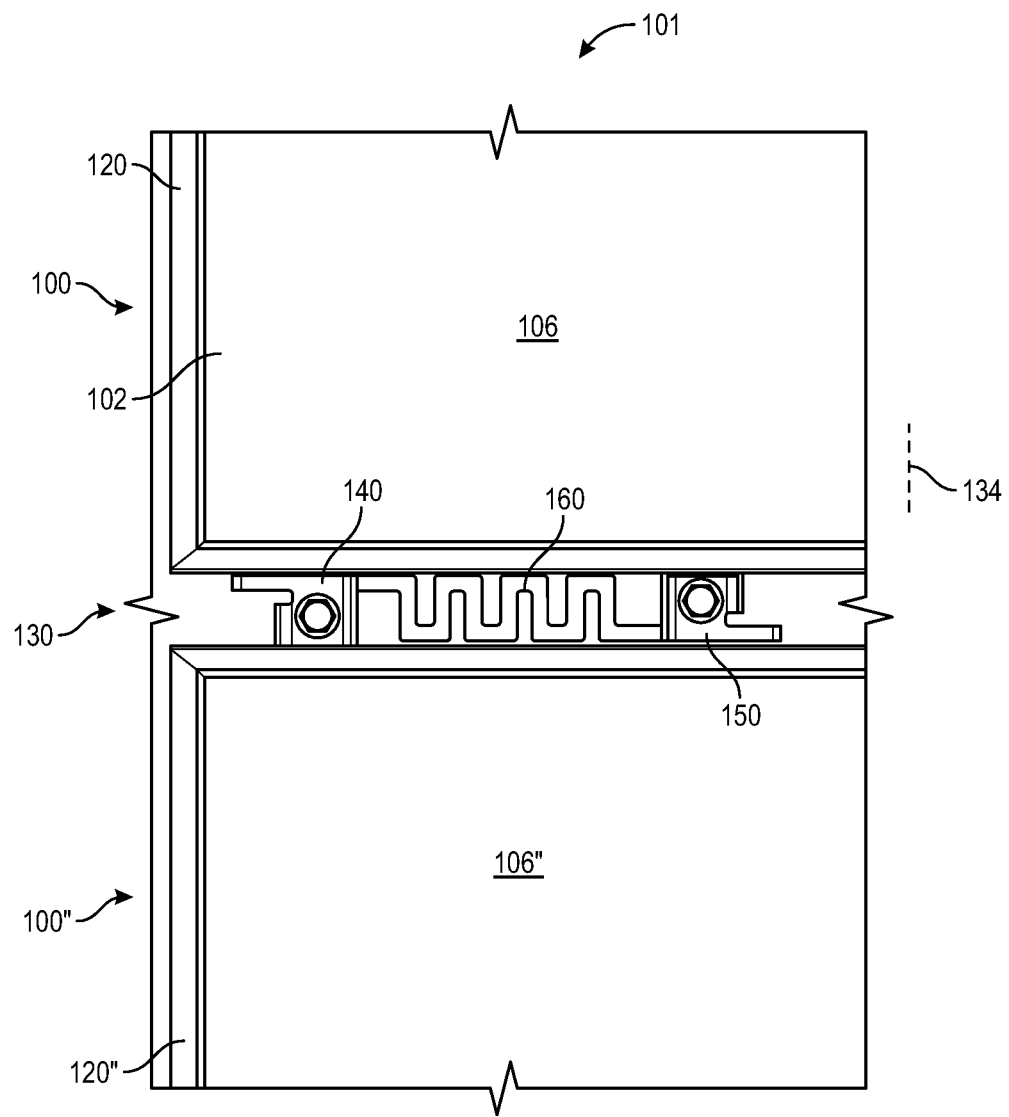
FIG. 3 depicts a front side view of a PV assembly, in accordance with an embodiment of the present disclosure.

FIG. 3 depicts a magnified top-down view of PV array 101 comprising first module 100 and second module 100". First and second modules 100/100" each comprise PV laminate 106/106" surrounded by frame 120/120". The flexible grounding connector 130 comprises a first electrically conductive engagement head 140 engaged with the first PV module 100 and a second electrically conductive engagement head 150 engaged with the second PV module 100". The flexible grounding connector 130 further comprises a flexible body portion 160 coupling the first and second electrically conductive engagement heads 140/150. As depicted in FIG. 3, the flexible grounding connector 130 electrically connects frames 120/120" of PV modules 100/100" so as to provide an electrical grounding path between PV module 100 of row 112 and PV module 100" of row 114.

Figure 4:
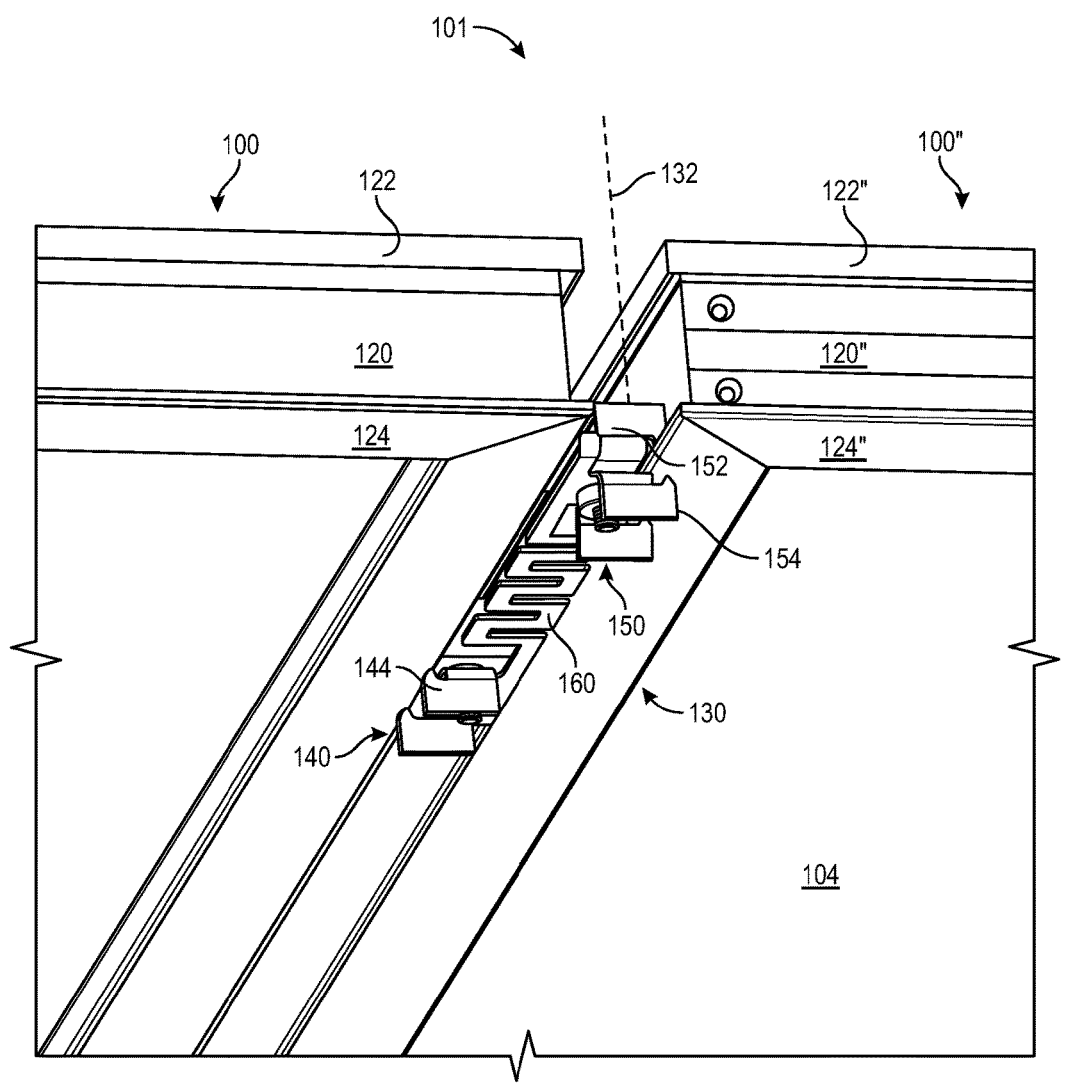
FIG. 4 depicts a back side view of a PV assembly, in accordance with an embodiment of the present disclosure.

FIG. 4 depicts a perspective back side view of PV array 101 comprising flexible grounding connector 130 electrically coupling first and second modules 100/100". In an embodiment, a PV module frame can comprise one or more circumferentially extending and/or longitudinally extending ridges, flanges or edges. As depicted in FIG. 4, frames 120/120" comprise upper circumferentially extending ridges 122/122" and lower circumferentially extending ridges 124/124". In an embodiment, any desirable surface feature on the PV module, laminate and/or frame can be provided. For example, a PV module frame can comprise flanges, lips, ridges, recesses, projections, sinusoidal cross sections, sawtooth cross sections, substantially planar surfaces, combinations thereof, or derivatives thereof.

The first electrically conductive engagement head 140 of the flexible grounding connector 130 comprises a clamping or fastening feature to engage the outer side edge 124 of the first PV module 100. Similarly, the second electrically conductive engagement head 150 of the flexible grounding connector 130 comprises a clamping or fastening feature to engage the outer side edge 124" of the second PV module 100". The electrically conductive flexible body portion 160 couples the first and second clamping heads 140/150. As depicted in FIG. 4, the flexible body portion 160 extends parallel to the upper and lower circumferentially extending ridges 122/124. In one embodiment, the flexible grounding connector 130 is flexible in a vertical or first direction 132 substantially perpendicular to the outer side edges 122/124 of the PV module 100.

In the embodiment depicted in FIG. 4, the first and second clamping heads 140/150 of the flexible grounding connector 130 engage with the lower circumferentially extending ridges 124/124". However, in other embodiments, a flexible grounding connector can engage with upper circumferentially extending ridges or a combination of upper and lower circumferentially extending ridges. In various embodiments, one or more flexible grounding connectors can engage with one or more lower surface features, one or more upper surface features, or a combination thereof.

Figure 5:
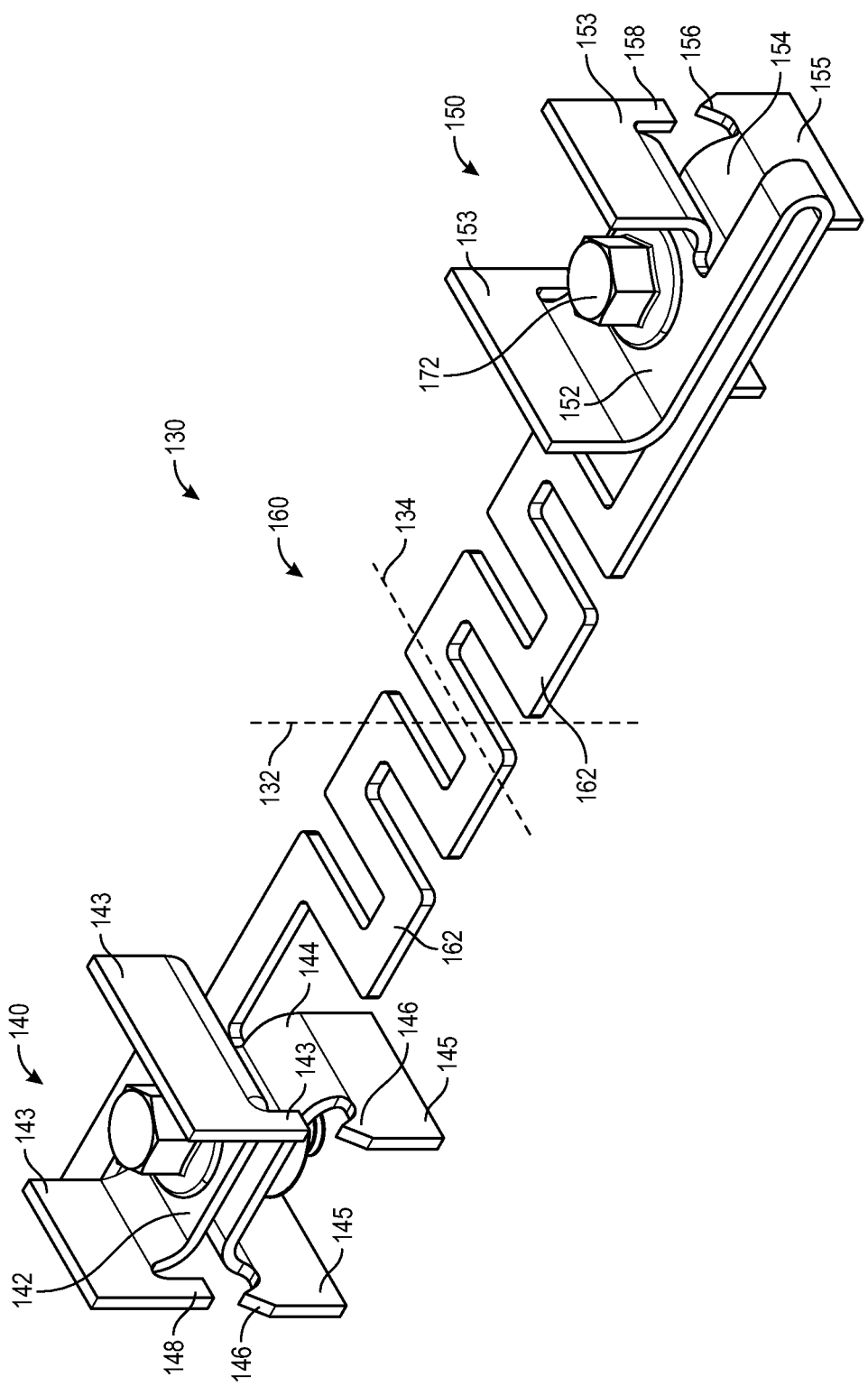
FIG. 5 depicts a flexible grounding connector, in accordance with an embodiment of the present disclosure.

FIG. 5 depicts a perspective view of flexible grounding connector 130 comprising first and second engagement or clamping heads 140/150. As depicted in FIG. 4 and FIG. 5, the first electrically conductive clamping head 140 comprises an upper clamping portion 142 and a lower clamping portion 144 configured to engage with or clamp on the lower circumferentially extending ridge 124 of module 100. Similarly, the second electrically conductive clamping head 150 comprises an upper clamping portion 152 and a lower clamping portion 154 configured to clamp on or around the lower circumferentially extending ridge 124" of module 100".

As depicted in FIG. 5, the upper clamping portions 142/152 of heads 140/150 comprise flanges 143/153 extending upward from the grounding connector 130. Similarly, the lower clamping portions 144/154 of heads 140/150 comprise flanges 145/155 extending downward from the grounding connector 130.

In an embodiment, one or more engagement heads of a flexible grounding connector comprise surface disrupting elements or features to facilitate electrical contact between the grounding connector 130 and the module 100. As depicted in FIG. 5, the lower clamping portions 144/154 of clamping heads 140/150 comprise a plurality of pierce points or teeth 146/156 formed integrally with flanges 145/155. To ensure suitable electrical contact between the grounding connector 130 and frame 120, teeth 146/156 can act as surface-disrupting elements. Pierce points, teeth or other structures can cut through any nonconductive material on PV module and/or frame, thereby creating a positive electrical connection to the grounding connector. Other surface-disrupting methods could also be used, such as causing grounding connector 130 to slide against and score a portion of frame 120 or through the use of other types of surface-disrupting structures or procedures. Those skilled in the art will envision various types of structures or procedures within the scope of the technology described herein to facilitate electrical grounding, for example that can be required by Underwriters Laboratories (UL).

As depicted in FIG. 5, the upper clamping portions 142/152 of clamping heads 140/150 comprise a plurality of projections 148/158 formed integrally with flanges 145/155. Projections 148/158 or other surface features can facilitate engagement or clamping of the grounding connector 130 with the module 100. Any desirable combination of surface elements, projections, pierce points and/or teeth can be included to facilitate engagement of the engagement heads with the module and/or frame.

In an embodiment, the flexible grounding connector 130 comprises metallic elements and/or other electrically conductive materials. For example, the flexible grounding connector 130 is provided as an aluminum or stainless steel stamped metal piece or formed wire. In another embodiment, a flexible grounding connector can comprise a metallic sheet or wire embedded within a nonconductive casing or sheath (e.g., polymeric and/or thermoplastic material). Any desirable manufacturing method can be employed. For example, flexible grounding connectors can be formed from extruded and/or machined aluminum, stamped or brake formed steel, etc.

In an embodiment, a flexible grounding connector comprises a flexible shape and/or material. For example, a flexible grounding connector can comprise a flexible metal wire or sheet. In some embodiments, a flexible grounding connector can comprise features for facilitating flexibility. As depicted in FIG. 5, the flexible body portion 160 of the flexible grounding connector 130 comprises a serpentine structure having repeating square curves or waves 162. The serpentine structure of the flexible grounding connector 130 can facilitate flexibility in a vertical or first direction 132 to accommodate any misalignment or offset between first and second PV modules 100/100". The flexible grounding connector can comprise any suitable structure including but not limited to a serpentine structure, a braided structure, a spring tensioned structure, a sinusoidal shaped structure, an S-shaped structure, a spiral structure, a coil, a spring, or a combination thereof.

Figure 6:
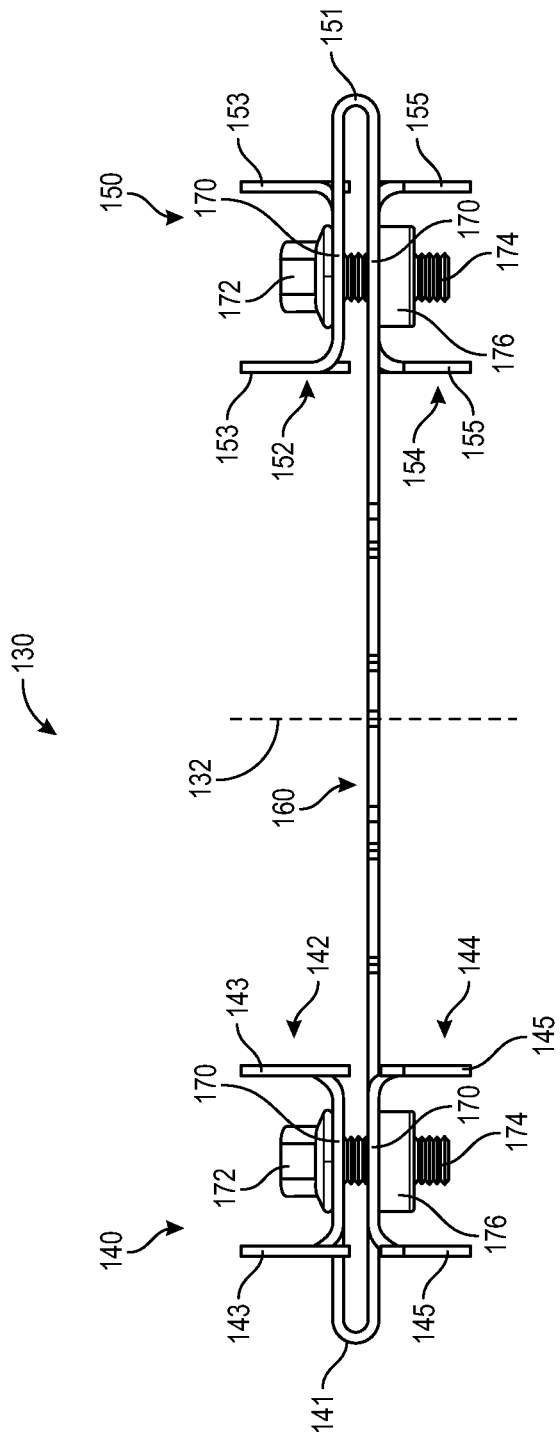
FIG. 6 depicts a side view of a flexible grounding connector, in accordance with an embodiment of the present disclosure.

FIG. 6 depicts a side view of flexible grounding connector 130 comprising first and second clamping heads 140/150. The upper and lower clamping portion 142/144 of head 140 each comprise a hole or slot 170 formed therethrough for receiving a fastener or screw 172. The fastener 172 can comprise a threaded portion 174. In some embodiments, the fastener 174 can be secured with a nut 176 located at the lower clamping portion. In one embodiment, the nut 176 can be welded to the lower clamping portion 144. In some embodiments, the nut 176 can comprise an inner threaded portion to receive a threaded portion of a fastener. Similarly, the upper and lower clamping portions 152/154 of head 150 each comprise a hole or slot 170 formed therethrough for receiving another fastener 172. In the embodiment depicted in FIG. 5, the head of the fasteners 172 do not protrude above the top surface of flanges 143/153. In the embodiment depicted in FIG. 6, the fastener 172 is provided as a separately formed screw. However, any desirable fastener or combination of fasteners can be employed (e.g., bolt, screw, nut, pin, clamp, clip, rivet and so on). In some embodiments, a fastening device can be integrally formed with the flexible grounding connector head 140/150 and/or body 160.

In some embodiments, a flexible grounding connector can be integrally formed. In one embodiment, a flexible grounding connector is formed as a stamped metal sheet or piece. A flexible grounding connector can comprise one or more bends or curves to form any desirable feature. As depicted in FIG. 6, the flexible grounding connector 130 comprises linear body portion 160 between a first and second hinge portion 141/151 formed by bends in a single piece of material (e.g., metal) at a first and second end 141/151 of a single metal piece. In this way, bend or hinge 141 forms the upper and lower clamping portions 142/144 of head 140. Similarly, bend or hinge 151 forms the upper and lower clamping portions 152/154 of head 150. Furthermore, flanges 143/145 are integrally formed from upward bends in the single piece of material (e.g., metal). The plurality of pierce points or teeth 146/156 are integrally formed with flanges 145/155 and projections 148/158 are integrally formed with flanges 145/155.

Figure 7A:
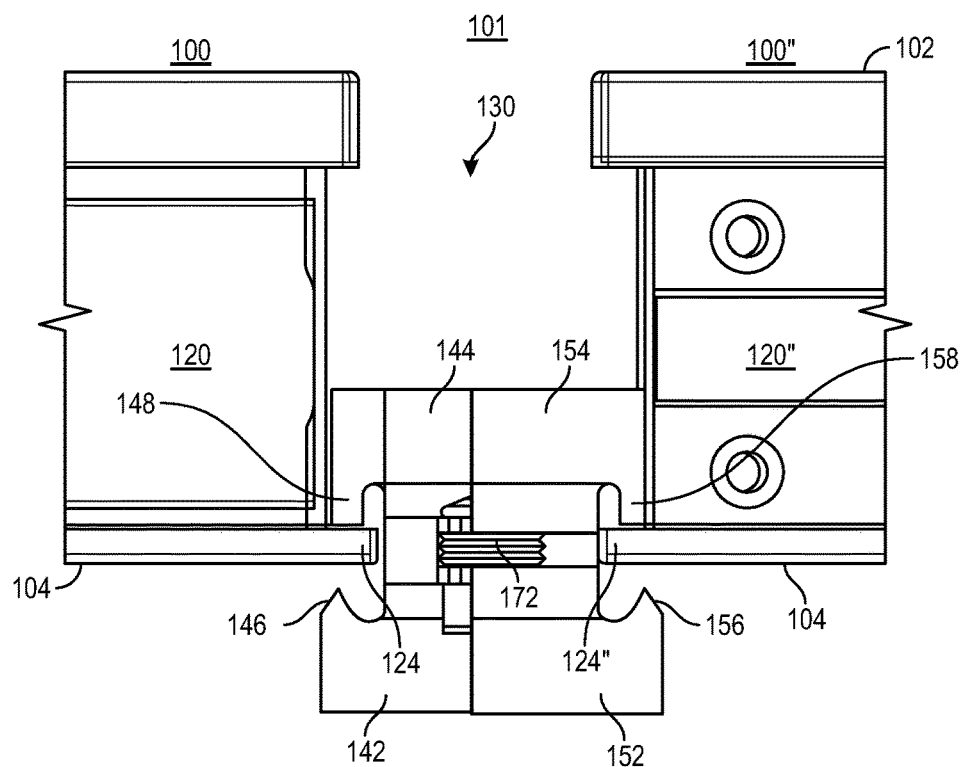
FIGS. 7A and 7B depict a side view of a PV assembly, in accordance with an embodiment of the present disclosure.
Figure 7B:
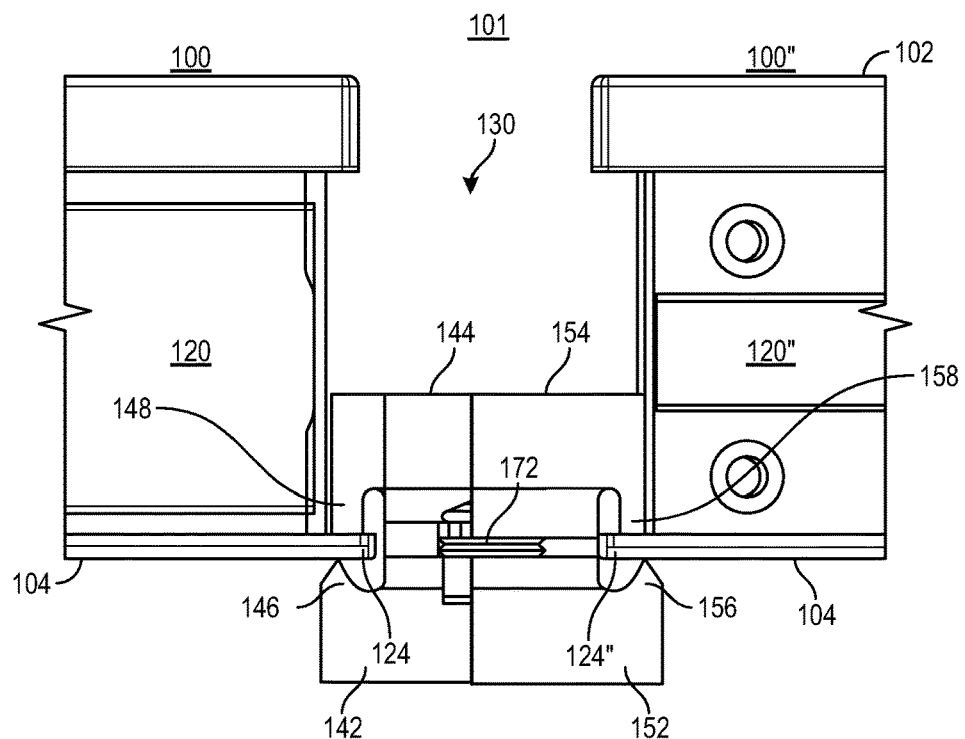

FIGS. 7A and 7B depict a side view of PV assembly 101 comprising flexible grounding connector 130 between adjacent PV modules 100/100". FIG. 7A depicts the flexible grounding connector 130 in a first position (e.g., unengaged, open, unlocked or unclamped position). The flexible grounding connector 130 can be put into a second position (e.g., engaged, closed, locked or clamped position) by turning or tightening screw 172 such that the upper and lower clamping portions (i.e. 142/144 of the first clamp head 140 and 152/154 of the second clamp head 150) are brought closer together. In the second position depicted in FIG. 7B, the pierce points 146/156 engage or bear against the outer back side 104 edge of the PV module frames 120/120" when the upper and lower clamping portions are secured by the fastener 172, thereby providing an electrical grounding path between the modules 100/100". The projections 148/158 can facilitate engagement of the grounding connector 130 with the module 100 by capturing the ridge 124 of frame 120 between the pierce points 146/156 and projections 148/158.

In an embodiment, the flexible grounding connector 130 can be transitioned from the first position to the second position by hand and/or by using a suitable tool (e.g., clamp, pliers, ratchet, screwdriver, wrench, etc.) to secure the grounding connector 130 to the PV module 120. A PV installer can secure the flexible grounding connector from the front side 102, the back side 104 or from any other desirable side of the PV array 101.

In an embodiment, the flexible grounding connector can be provided so as to accommodate deflection in the vertical or first direction 132. For example, the flexible body portion 160 can be flexible so as to provide a predetermined maximum deflection distance between the first and second clamping heads in the vertical or first direction 132. As a non-limiting example the predetermined maximum deflection distance between the first and second clamping heads in the vertical or first direction 132 is greater than 5 mm along the vertical or first direction 132.

In some embodiments, the flexible grounding connector is substantially rigid in a second direction 134 so as to set a predetermined distance between adjacent PV modules. For example the flexible grounding connector 130 can comprise a body portion 160 having a width in the horizontal or second direction 134 less than 20 mm. In other embodiments, the flexible grounding connector can be flexible in the horizontal or second direction 134 so as to provide a predetermined maximum deflection distance between the first and second clamping heads in the horizontal or second direction 134. As a non-limiting example, the predetermined maximum deflection distance between the first and second clamping heads in the horizontal or second direction 134 is greater than 5 mm along the horizontal or second direction 134.

FIG. 1-7 illustrate various embodiments of PV assemblies and flexible grounding connectors. Unless otherwise specified below, the numerical indicators used to refer to components in the FIG. 8-14 are similar to those used to refer to components or features in FIG. 1-7 above, except that the index has been incremented by 100.

Figure 8:
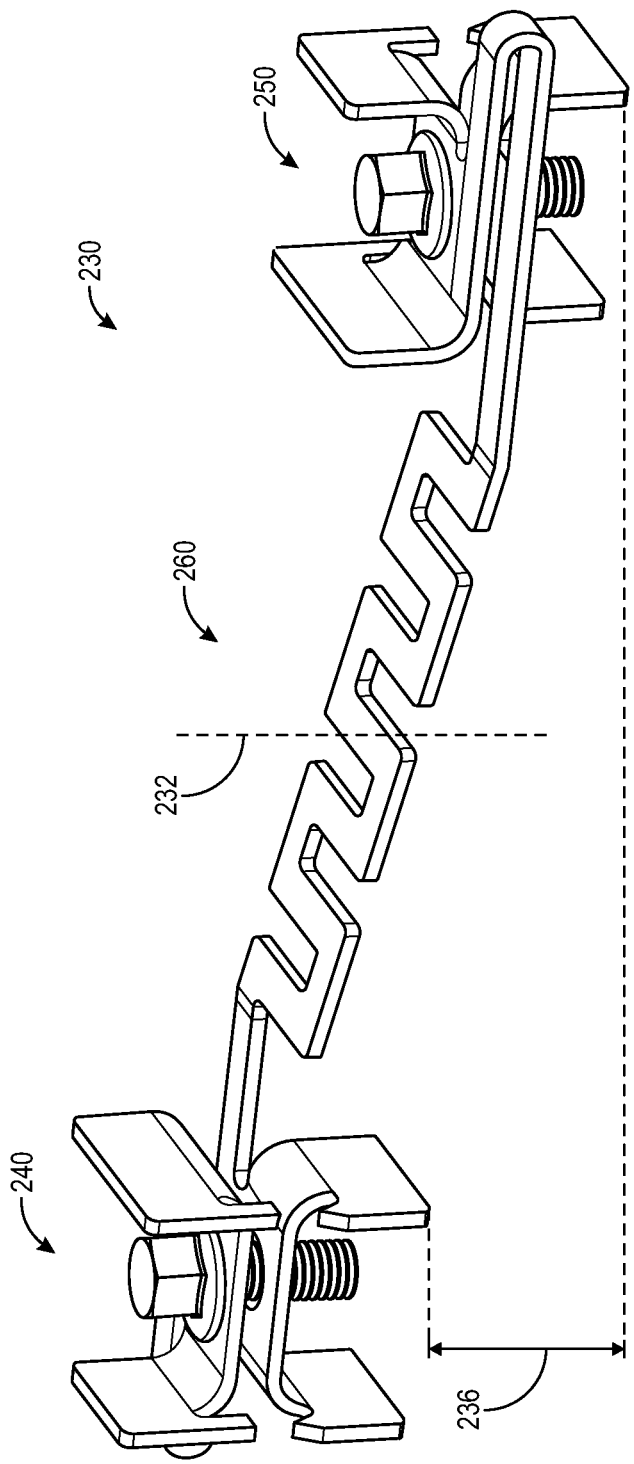
FIG. 8 depicts a flexible grounding connector, in accordance with an embodiment of the present disclosure.

In another embodiment depicted in FIG. 8, a grounding connector 230 comprises a body portion 260 between a first engagement head 240 and a second engagement head 250. The body portion 260 of grounding connector 230 can be sloping or inclined so as to offset the first and second engagement heads 240/250 in a vertical or first direction 232. For example, the flexible body portion 260 can be sloped or inclined so as to provide a predetermined distance or offset 236 between the first and second clamping heads 240/250 along the vertical or first direction 232. As a non-limiting example, the predetermined distance or offset 236 between the first and second clamping heads 240/250 in the vertical or first direction 232 is greater than 5 mm along the vertical or first direction. In some embodiments, the sloped or inclined body portion 260 of grounding connector 230 can be substantially rigid, however in other embodiments, the sloped or inclined body portion 260 of grounding connector 230 can be flexible so as to accommodate deflection beyond the predetermined distance or offset 236 in the vertical or first direction 232.

Figure 9:
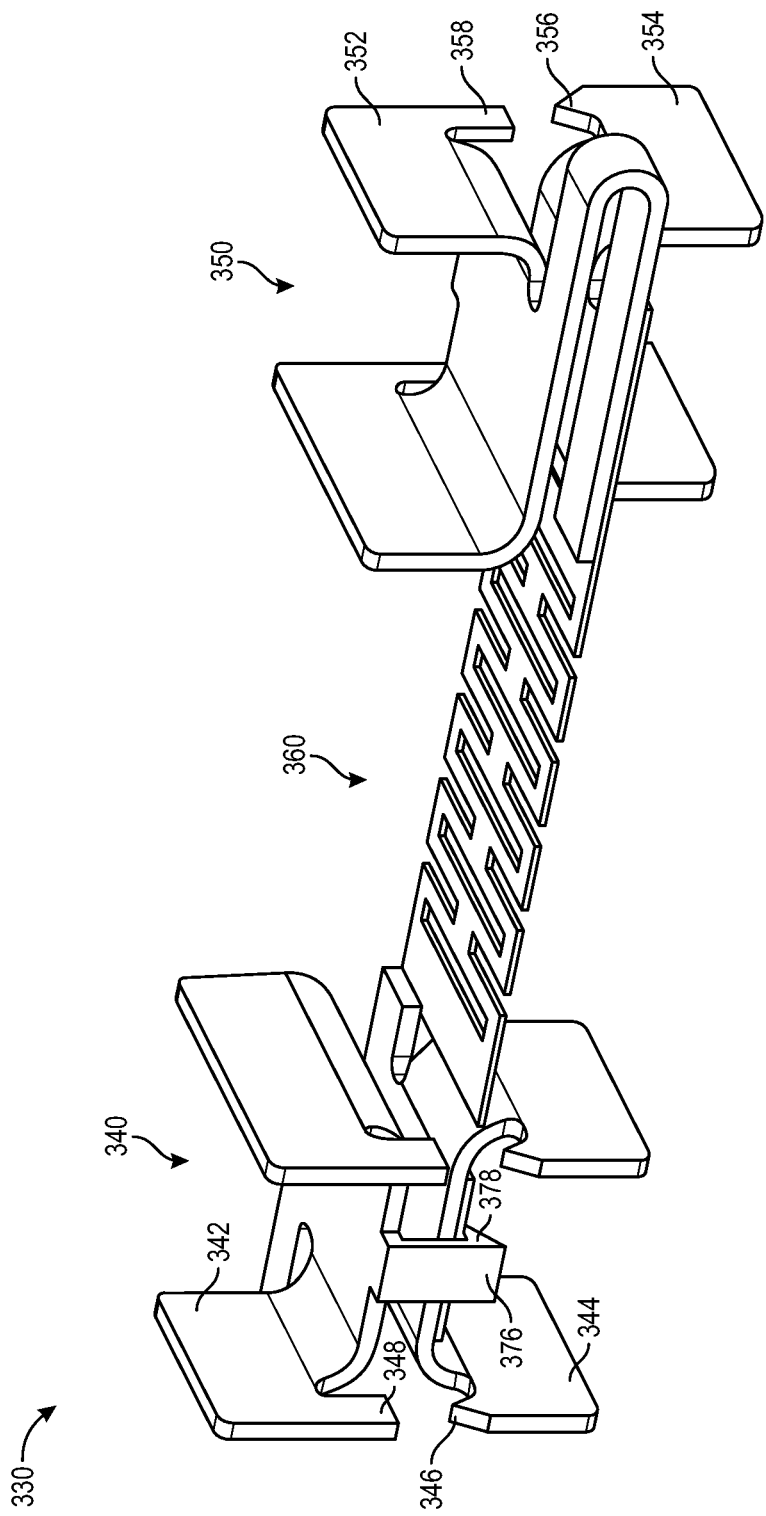
FIG. 9 depicts a flexible grounding connector, in accordance with an embodiment of the present disclosure.

FIG. 9 depicts a grounding connector 330 according to another embodiment. The grounding connector 330 comprises a flexible body portion 360 between first and second engagement heads 340/350. The flexible body portion 360 comprises a stamped pattern on a metal sheet comprising voids to facilitate flexibility. The upper and lower clamping portion 342/344 of head 340 are shown in a second or engaged position which is enabled by engagement or interlocking of a locking feature 376. In the embodiment depicted in FIG. 9, the locking feature 376 is integrally formed with the upper clamping portion 342 and comprises a projection 378 for locking or engaging with the lower clamping portion 344. The locking feature 376 can comprise a projection 378 for engaging the lower clamping portion 344, thereby securing or clamping the clamping head 340 to a PV module. In other embodiments, a locking feature can be provided as a separate clip or component. Any desirable locking mechanism or feature can be employed (e.g., clamp, clip, hook, snap-in feature and so on). The locking feature may be engaged by hand and/or by using a suitable tool (e.g., clamp, pliers, ratchet, screwdriver, wrench, etc.). In an embodiment, the pierce points 346/356 and projections 348/358 bear against a PV module when the upper and lower clamping portions are secured by locking feature 376, thereby providing an electrical grounding path between adjacent PV modules.

Figure 10:
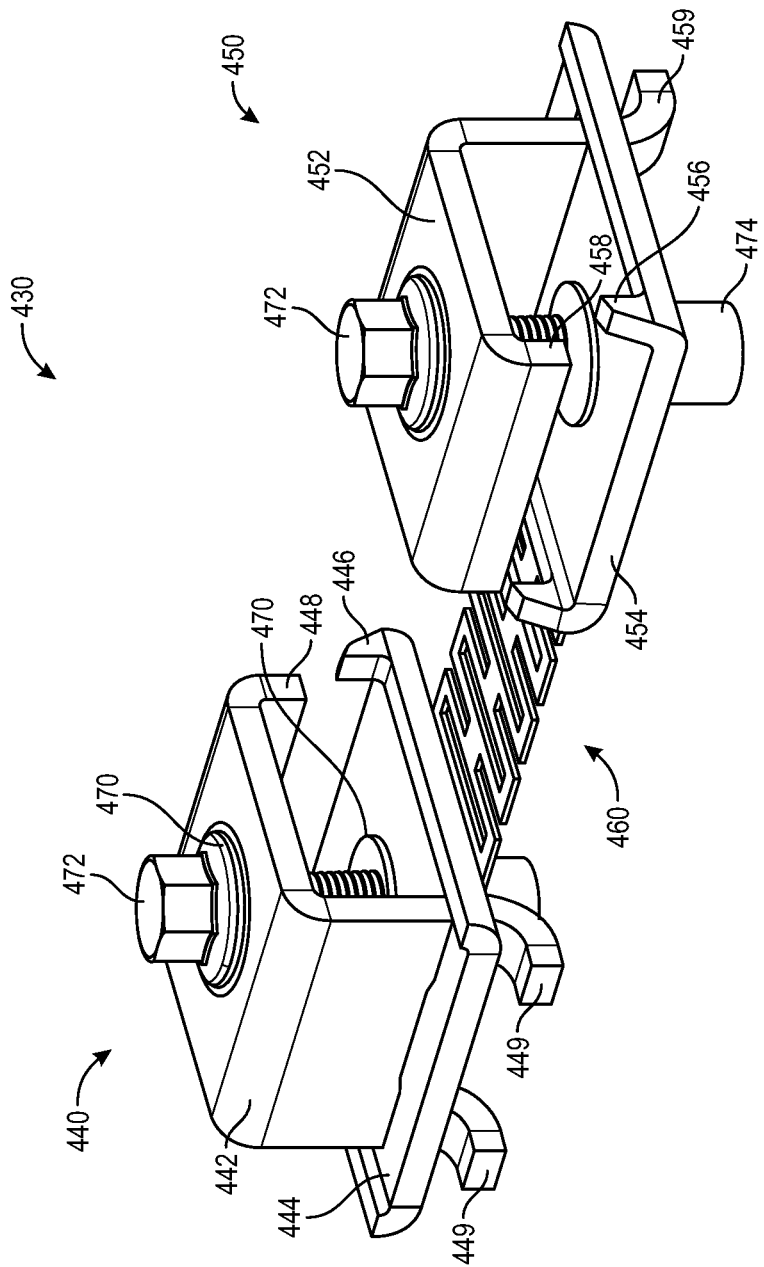
FIG. 10 depicts a flexible grounding connector, in accordance with an embodiment of the present disclosure.

In an embodiment, a grounding connector can be formed from an assembly of parts (e.g., clamping heads, body portion and/or engagement mechanism). FIG. 10 depicts a top side view of a flexible grounding connector 430 comprising first and second clamping heads 440/450 formed from an assembly of parts. The upper and lower clamping portions 442/444 and 452/454 are each provided as a separate component or piece. The upper and lower clamping portions 442/444 of head 440 each comprise a hole or slot 470 formed therethrough for receiving fastener 472. Similarly, the upper and lower clamping portions 452/454 of head 450 each comprise a hole or slot formed therethrough for receiving fastener 472. In the embodiment depicted in FIG. 10, the upper clamping portion 442/452 comprises projections 449/459 for aligning or securing the upper clamping portion 442/452 with the lower clamping portion 444/454. In some embodiments, the fastener 472 can be secured with a nut 474 at lower clamping portion 444/454. In an embodiment, the pierce points 446/456 and projections 448/458 bear against a PV module when the upper and lower clamping portions are secured by fastener 472, thereby providing an electrical grounding path between adjacent PV modules.

Figure 11:
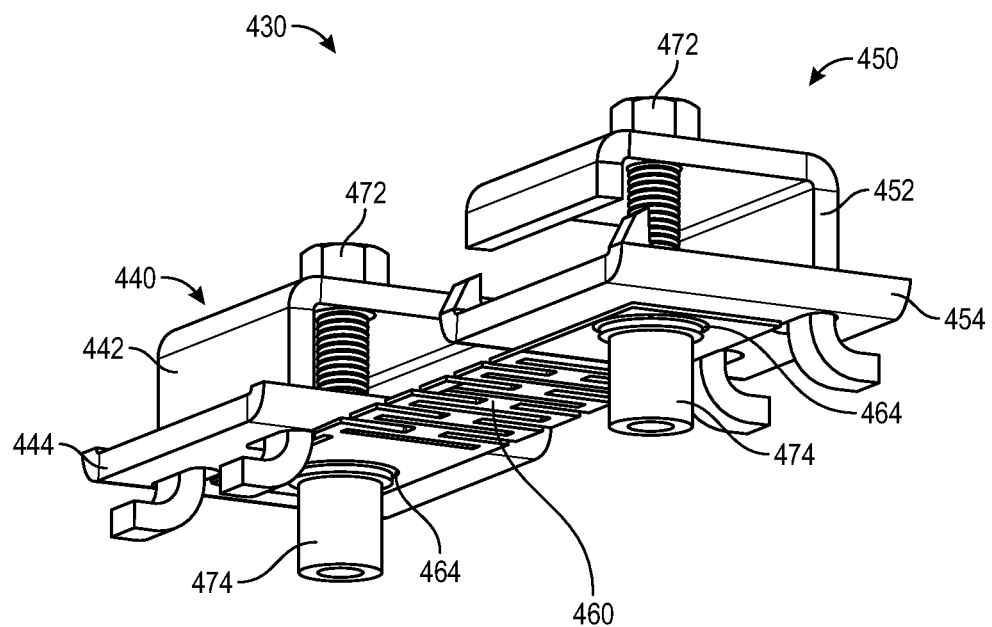
FIG. 11 depicts a back side view of a flexible grounding connector, in accordance with an embodiment of the present disclosure.

FIG. 11 depicts a bottom side view of flexible grounding connector 430. The flexible grounding connector 430 further comprises a flexible body portion 460 provided as a separate component or piece. The flexible body portion 460 comprises a plurality of slots or holes 464 for receiving fastener 472 and for seating nut 474. The flexible body portion 460 is secured to the upper and lower clamping portions 442/444 and 452/454 by the fastener 472 and nut 474 when the flexible grounding connector 430 is in an engaged position upon tightening of fastener 472, thereby providing an electrical grounding path between first and second engagement heads 440/450.

Figure 12:
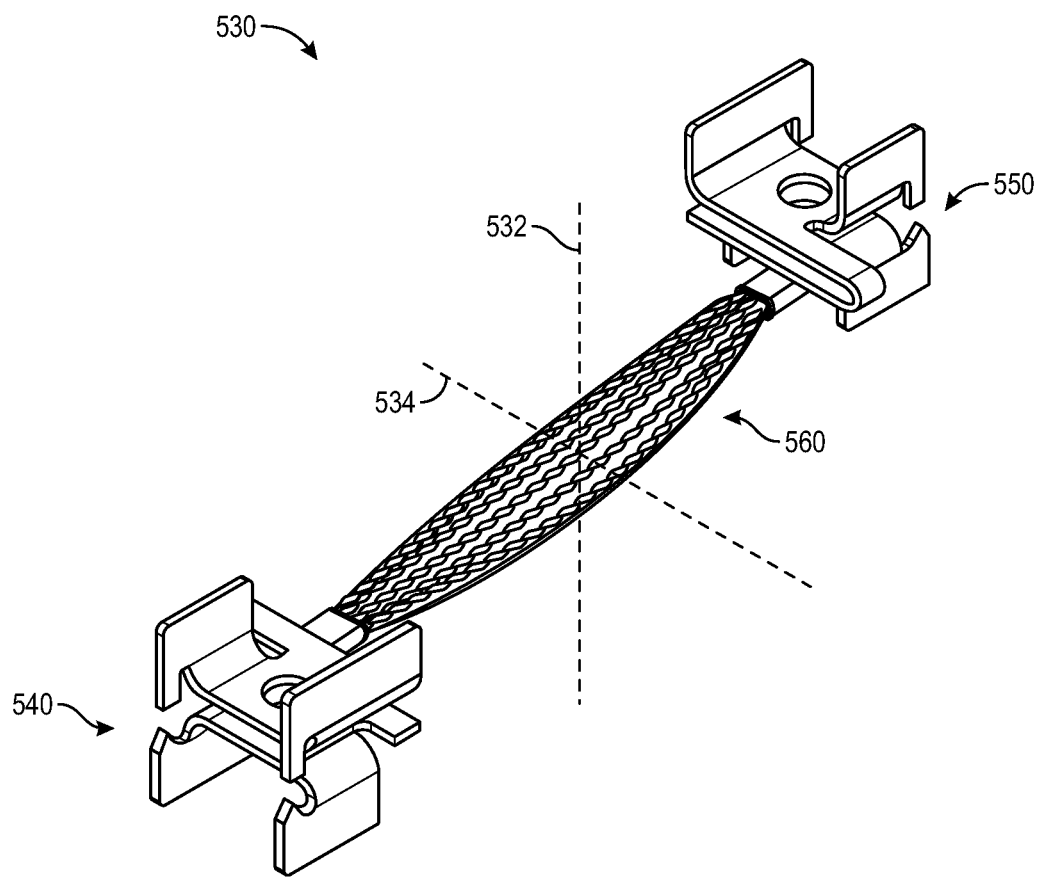
FIG. 12 depicts a flexible grounding connector, in accordance with an embodiment of the present disclosure.

FIG. 12 depicts a flexible grounding connector 530 according to another embodiment of the present disclosure. The grounding connector 530 comprises a flexible braided body portion 560 between first engagement head 540 and a second engagement head 550. The body portion 560 of flexible grounding connector 530 can comprise loosely braided strands of wire so as to facilitate flexibility in vertical direction 532 and/or a horizontal direction 534, thereby accommodating any misalignment or offset between PV modules of a PV array. In one embodiment, the flexible grounding connector 530 can electrically connect adjacent PV modules and in other embodiments the flexible grounding connector 530 can connect PV modules that are not directly adjacent. In some embodiments, braided strands of wire can loosely encircle an inner structure or material immediately underlying said braided strands of wire. However in other embodiments, an inner structure or material can be absent.

Figure 13:
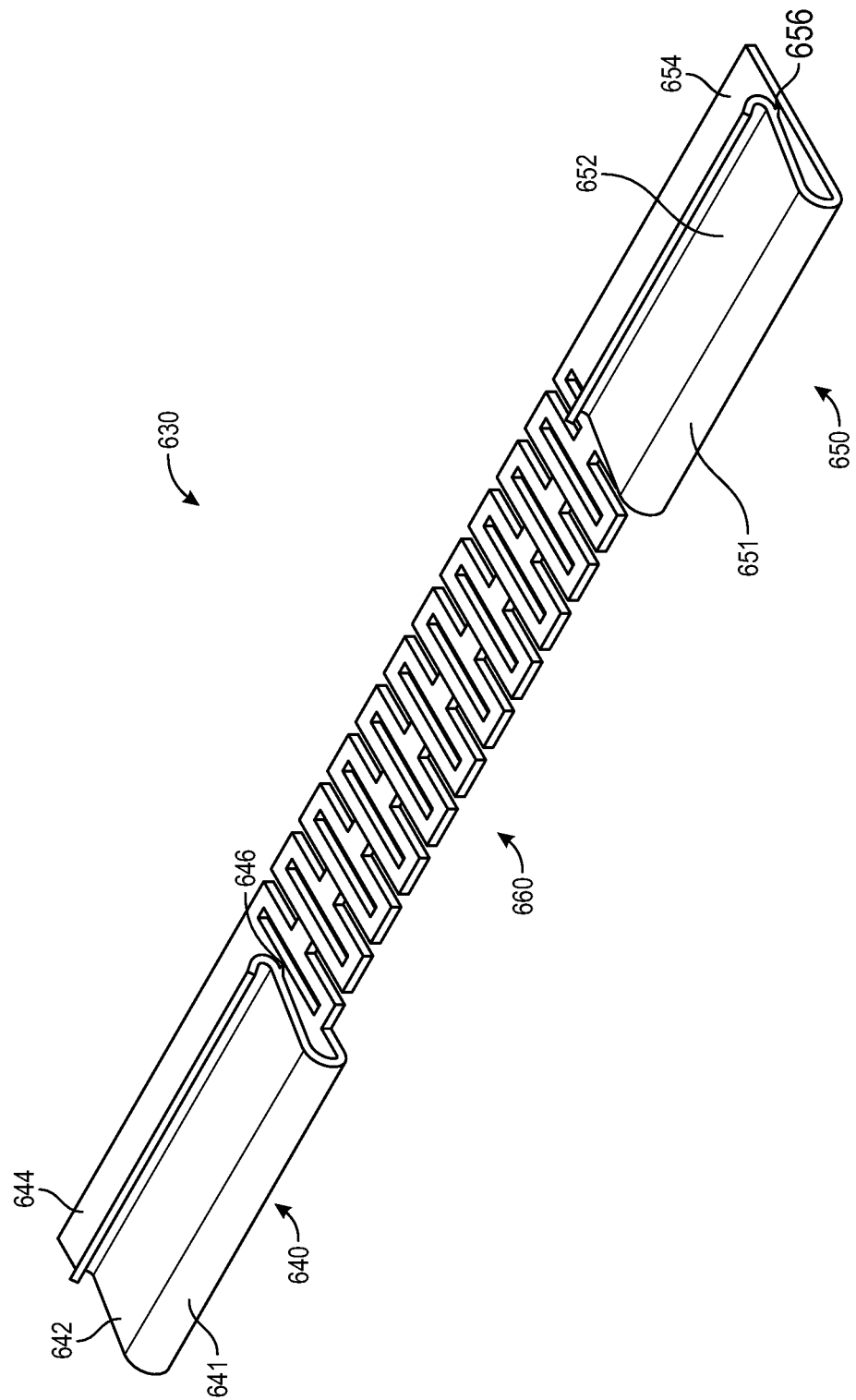
FIG. 13 depicts a flexible grounding connector, in accordance with an embodiment of the present disclosure.

In the embodiments described above, engagement or clamping heads of grounding connectors can engage one or more outer surface features located at an outer side edge a PV module. In other embodiments, engagement or clamping heads of grounding connectors can engage one or more surface features located underneath or at a back side of a PV module. FIG. 13 depicts a flexible grounding connector 630 comprising body portion 660 between first engagement head 640 and a second engagement head 650. The flexible grounding connector 630 is provided as a single integral piece, for example an aluminum or stainless steel stamped metal sheet. The flexible grounding connector 630 comprises linear body portion 660 between a first and second hinge portion 641/651 formed by bends in the stamped metal sheet. In this way, bend or hinge 641 forms the upper and lower clip portions 642/644 of head 640. Similarly, bend or hinge 651 forms the upper and lower clip portions 652/654 of head 650. In some embodiments, the upper and lower clip portions 652/654 comprise a pierce point 646/656 to facilitate grounding. Described in other words, the engagement heads 640/650 comprise integrally formed clip structures for engaging with or fastening to a PV module.

Figure 14A:
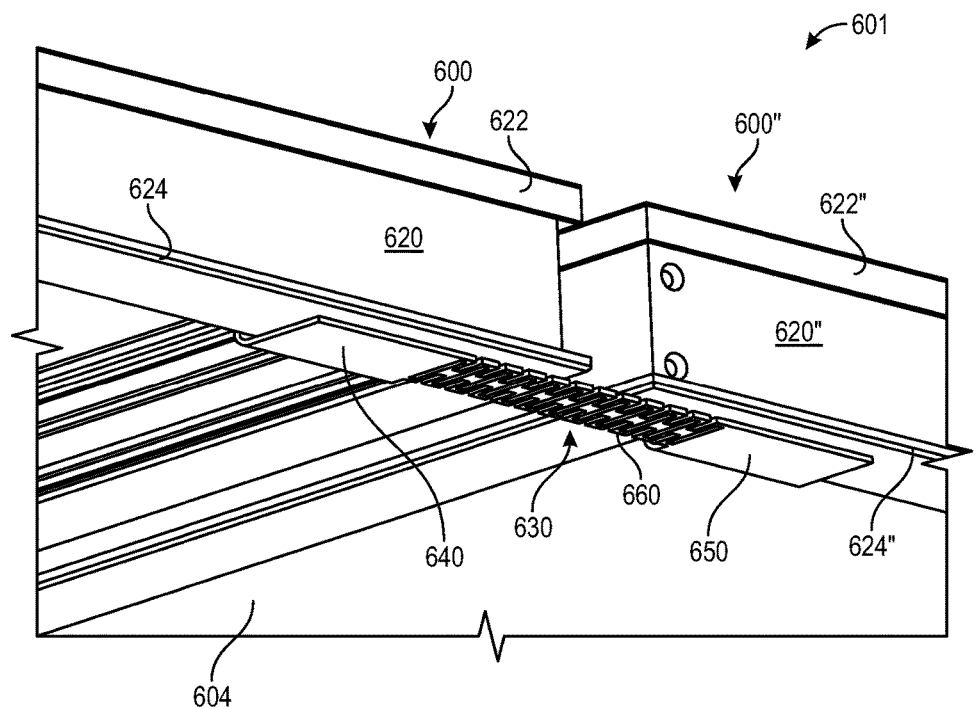
FIGS. 14A and 14B depict a back side view of a PV assembly, in accordance with an embodiment of the present disclosure.
Figure 14B:
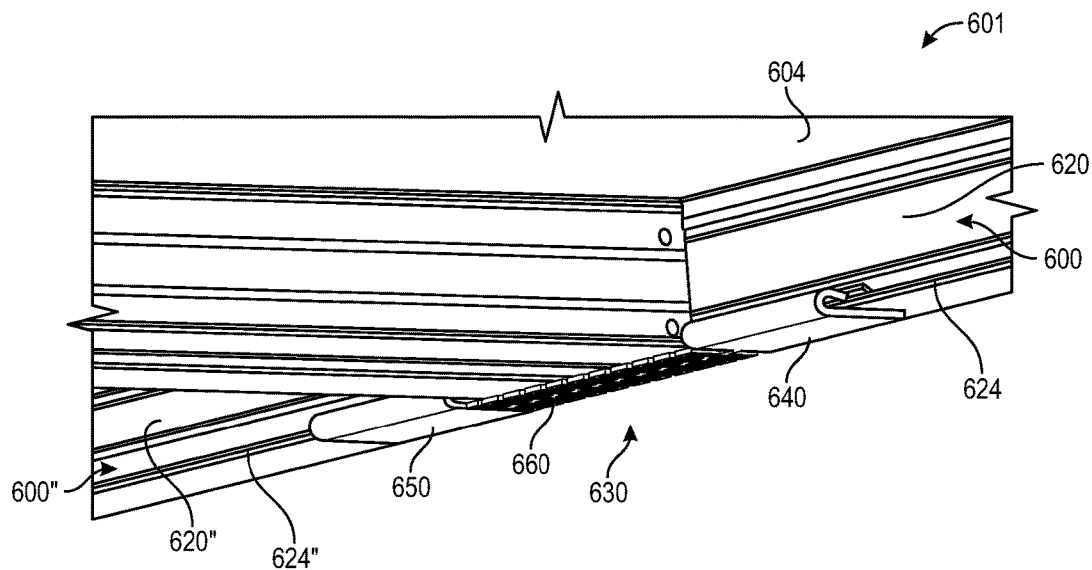

FIGS. 14A and 14B depict a back side view of a PV assembly comprising flexible grounding connector 630 comprising engagement heads 640/650 having integrally formed clip structures for engaging with or fastening to a PV module. FIG. 14A depicts a view from an outer back side 604 of modules 600/600" in PV array 601 and FIG. 14A depicts a view from an inner back side 604 of modules 600/600" in PV array 601. The first engagement or clip head 640 of the flexible grounding connector 630 engages with lower circumferentially extending ridge 624 of module 600. Similarly, second engagement or clip head 650 of the flexible grounding connector 630 engages with lower circumferentially extending ridge 624" of module 600". The body portion 660 of flexible grounding connector 630 provides an electrical grounding path between the first module 600 and the second module 600". The flexible grounding connector 630 provides an electrical grounding path between adjacent modules 600/600", however, in other embodiments the flexible grounding connector 630 can establish an electrical grounding path between PV modules that are not directly adjacent.

Figure 15:
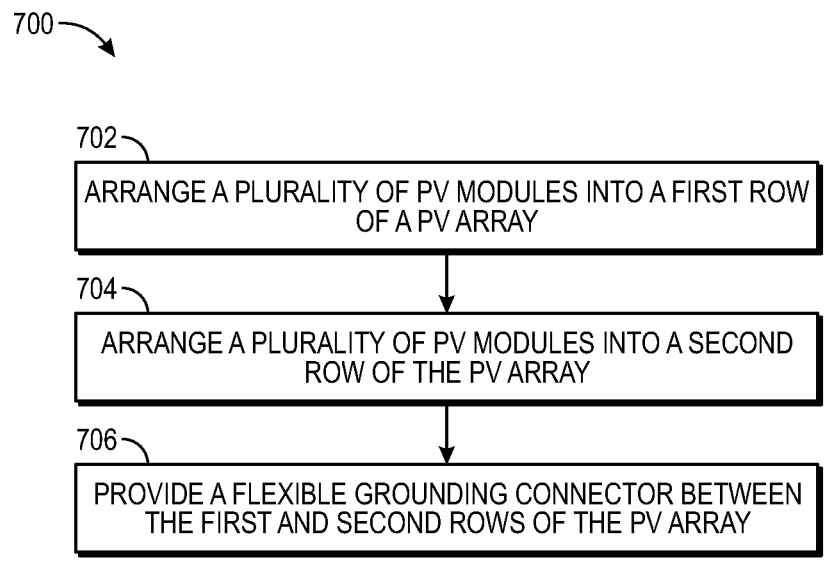
FIG. 15 depicts a flowchart listing operations in a method for assembling a PV array, in accordance with an embodiment of the present disclosure.

Improved methods for installing a plurality of PV modules to form PV arrays are also described herein. FIG. 15 depicts a flowchart 700 listing operations in a method for assembling a PV array comprising a plurality of PV modules, in accordance with an embodiment of the present disclosure. Referring to operation 702 of flowchart 700, a method for assembling a PV array comprises arranging a plurality of PV modules into a first row of the PV array. The method further comprises arranging a plurality of PV modules into a second row of the PV array at operation 704. Referring to operation 706 of flowchart 700, a method for assembling a PV array further comprises providing a flexible grounding connector between the first and second rows. The operation 706 can comprise the operation of engaging a first electrically conductive engagement head of the flexible grounding connector with one of the plurality of PV modules in the first row. The operation 706 can further comprise engaging a second electrically engagement head of the flexible grounding connector with one of the plurality of PV modules in the second row such that the flexible grounding connector provides an electrical grounding path between the first and second rows of the PV array.

The above specification and examples provide a complete description of the structure and use of illustrative embodiments. Although certain embodiments have been described above with a certain degree of particularity, or with reference to one or more individual embodiments, those skilled in the art could make numerous alterations to the disclosed embodiments without departing from the scope of this invention. As such, the various illustrative embodiments of the methods and systems are not intended to be limited to the particular forms disclosed. Rather, they include all modifications and alternatives falling within the scope of the claims, and embodiments other than the one shown can include some or all of the features of the depicted embodiment. For example, elements can be omitted or combined as a unitary structure, and/or connections can be substituted. Further, where appropriate, aspects of any of the examples described above can be combined with aspects of any of the other examples described to form further examples having comparable or different properties and/or functions, and addressing the same or different problems. Similarly, it will be understood that the benefits and advantages described above can relate to one embodiment or can relate to several embodiments. For example, embodiments of the present methods and systems can be practiced and/or implemented using different structural configurations, materials, and/or control manufacturing steps. The claims are not intended to include, and should not be interpreted to include, means-plus- or step-plus-function limitations, unless such a limitation is explicitly recited in a given claim using the phrase(s) "means for" or "step for," respectively.

What is claimed is:

1. A photovoltaic (PV) assembly comprising:
 a first row of a PV array;
 a second row of a PV array adjacent to the first row, wherein the first and second rows each comprise:
   a plurality of PV modules, each PV module having a front side that faces the sun to collect solar radiation during normal operation and a back side opposite the front side, each PV module comprising:
     a laminate encapsulating a plurality of solar cells;
     a metal frame surrounding the laminate to define an outer side edge of the PV module;
 a flexible grounding connector positioned between the first and second rows, the flexible grounding connector comprising:
   a first electrically conductive clamping head for engaging the outer side edge of a first PV module in the first row of the PV array;
   a second electrically conductive clamping head for engaging the outer side edge of a second PV module in the second row of the PV array;
   the first and second electrically conductive clamping heads each comprising:
     an upper and lower clamping portion comprising at least one slot formed therethrough for receiving at least one fastener;
     at least one pierce point configured to bear against the outer side edge of a PV module when the upper and lower clamping portions are secured by the fastener, thereby providing an electrical grounding path;
   each flexible grounding connector further comprising an electrically conductive flexible body portion coupling the first and second clamping heads, the flexible body portion being flexible in a first direction substantially perpendicular to the outer side edge of the first and second PV modules, and wherein the flexible grounding connector provides an electrical grounding path between the first and second rows of the PV assembly.

2. The PV assembly according to claim 1, wherein the flexible body portion comprises a serpentine structure.

3. The PV assembly according to claim 2, wherein the serpentine structure comprises a plurality of square waves.

4. The PV assembly according to claim 1, wherein the frame comprises a longitudinally extending ridge, and wherein the upper and lower clamping portions of the flexible grounding connector are configured to engage the longitudinally extending ridge of the frame.

5. A photovoltaic (PV) assembly comprising:
a first and second PV module each comprising:
a laminate comprising a plurality of solar cells;
a frame at least partially surrounding the laminate;
at least one flexible grounding connector positioned between the first and second PV modules, the at least one flexible grounding connector comprising:
a first electrically conductive engagement head for engaging the first PV module;
a second electrically conductive engagement head for engaging the second PV module;
a flexible body portion coupling the first and second electrically conductive engagement heads, the flexible body portion being electrically conductive;
wherein the flexible grounding connector provides an electrical grounding path between the first and second PV modules, and
wherein the flexible grounding connector is formed as a single metal piece comprising a first and a second end, the first and second ends of the flexible grounding connector being curved to form the first and second electrically conductive engagement heads, and wherein the first and second electrically conductive engagement heads each comprise an upper clamping portion, a lower clamping portion and a hinge portion therebetween.

6. The PV assembly according to claim 5, wherein the first module is positioned in a first row of a PV array, the second module is positioned in a second row of the PV array, and the first row of the PV array is adjacent to the second row of the PV array.

7. The PV assembly according to claim 5, wherein the first and second electrically conductive engagement heads each comprise at least one pierce point configured to bear against the frame of a PV module.

8. The PV assembly according to claim 5, wherein the frame comprises a longitudinally extending ridge, and wherein the upper and lower clamping portions of the flexible grounding connector are configured to engage the longitudinally extending ridge of the frame.

9. The PV assembly according to claim 5, wherein the first and second electrically conductive engagement heads each comprise at least one slot formed therethrough for receiving at least one fastener.

10. The PV assembly according to claim 5, wherein the flexible body portion comprises a structure selected from the group of a serpentine structure, a braided structure, a spring tensioned structure, a sinusoidal shaped structure, an S-shaped structure, a spiral structure, a coil, a spring, or a combination thereof.

11. The PV assembly according to claim 5, wherein the flexible body portion is flexible in a first direction substantially perpendicular to an outer side edge of the PV module.

12. The PV assembly according to claim 11, wherein the flexible body portion is deformable to a distance greater that 5 mm along the first direction.

13. The PV assembly according to claim 5, wherein the electrically conductive engagement head engages an outer surface feature located at an outer side edge of the PV module.

14. The PV assembly according to claim 5, wherein the electrically conductive engagement head engages an outer surface feature located at a back side of the PV module.

15. The PV assembly according to claim 5, wherein the flexible body portion has a width less than 20 mm.

16. A flexible grounding connector for electrically connecting adjacent rows of a PV array, the flexible grounding connector comprising:
a first electrically conductive clamping head for engaging a first PV module in a first row of the PV array;
a second electrically conductive clamping head for engaging a second PV module in a second row of the PV array, the first and second electrically conductive clamping heads each comprising:
an upper and lower clamping portion comprising at least one slot formed therethrough for receiving at least one fastener;
at least one pierce point configured to bear against an outer surface of a PV module when the upper and lower clamping portions are secured by the fastener, thereby providing an electrical grounding path;
the flexible grounding connector further comprising an electrically conductive flexible body portion coupling the first and second clamping heads, the flexible body portion being flexible in a first direction substantially perpendicular to an outer side edge of the first and second PV modules, and wherein the flexible grounding connector provides an electrical grounding path between adjacent rows of the PV array.

17. The flexible grounding connector according to claim 16, wherein the flexible body portion is deformable to a distance greater that 5 mm along the first direction.

18. The flexible grounding connector according to claim 16, wherein the flexible body portion comprises a structure selected from the group of a serpentine structure, a braided structure, a spring tensioned structure, a sinusoidal shaped structure, an S-shaped structure, a spiral structure, a coil, a spring, or a combination thereof.

19. The flexible grounding connector according to claim 16, wherein the flexible grounding connector is formed as a single metal piece comprising a first and a second end, the first and second ends of the flexible grounding connector being curved to form the first and second electrically conductive clamping heads, and wherein the first and second electrically conductive clamping heads each comprise a hinge portion between the upper and lower clamping portions.

* * * * *